US008373479B1

(12) United States Patent
Ho et al.

(10) Patent No.: US 8,373,479 B1
(45) Date of Patent: Feb. 12, 2013

(54) DELAY LOCKED LOOP (DLL) CIRCUIT FOR IMPROVING JITTER

(75) Inventors: Ming-Jing Ho, Taipei (TW); Shih-Lun Chen, Taipei (TW)

(73) Assignees: Global Unichip Corp., Hsinchu (TW); Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 13/425,331

(22) Filed: Mar. 20, 2012

(30) Foreign Application Priority Data

Sep. 8, 2011 (TW) ............................ 100132357 A

(51) Int. Cl.
*H03L 7/06* (2006.01)

(52) U.S. Cl. ....................................... 327/158; 327/149

(58) Field of Classification Search .................. 327/149, 327/158

See application file for complete search history.

(56) References Cited

U.S. PATENT DOCUMENTS

| | | | | |
|---|---|---|---|---|
| 6,373,913 | B1 * | 4/2002 | Lee | 375/376 |
| 7,095,289 | B2 * | 8/2006 | Knoll et al. | 331/185 |
| 7,317,342 | B2 * | 1/2008 | Saint-Laurent | 327/295 |
| 7,737,744 | B2 * | 6/2010 | Choi | 327/158 |
| 2003/0117194 | A1 * | 6/2003 | Lee | 327/158 |
| 2009/0256603 | A1 * | 10/2009 | Choi | 327/158 |

* cited by examiner

*Primary Examiner* — Adam Houston

(74) *Attorney, Agent, or Firm* — McClure, Qualey & Rodack, LLP

(57) ABSTRACT

A delay locked loop (DLL) circuit for improving jitters includes a detecting unit, a master controller, a slave controller, first and second variable delay lines, first and second dummy loads, and a processor. The master controller generates a first control signal in response to a detecting signal. The slave controller generates a second control signal in response to the detecting signal. The first variable delay line delays a reference clock in response to the first control signal so as to generate a delay clock. The processor is configured to selectively generate a slave input signal, wherein if the processor does not generate the slave input signal, the processor makes the second dummy load draw a load current from the slave controller.

10 Claims, 4 Drawing Sheets

100
DCLK
112
Phase detector
SE
114
Charge pump
SD
116
Master controller
SC1
150
RCLK
MIP
110
118
CW1
Variable delay line
ENM
CL1
Dummy load
126
V1
120
Slave controller
170
SC2
122
CW2
SSO
ENS
CL2
Variable delay line
OUT
Dummy load
128
V1
SIC
124
Processor
SSI
SIP

DELAY LOCKED LOOP (DLL) CIRCUIT FOR IMPROVING JITTER

CROSS REFERENCE TO RELATED APPLICATIONS

This Application claims priority of Taiwan Patent Application No. 100132357 filed on 8 Sep. 2011, the entirety of which is incorporated by reference herein.

BACKGROUND OF THE INVENTION

1. Field of the Invention

The disclosure generally relates to a delay locked loop (DLL) circuit, and more particularly, relates to a delay locked loop circuit for improving jitters.

2. Description of the Related Art

With the development of the semiconductor process, very large scale integration (VLSI) system-on-chip (SoC) has become more popular. When systems are integrated on a chip, synchronized clocks are essential elements. Delay locked loop (DLL) circuits or phase locked loop (PLL) circuits are common used to clock/signal phase alignment.

If a real output clock differs from an ideal output clock, a jitter could occur. Jitters are serious problems of DLL or PLL circuits. Traditionally, a master-slave DLL circuit with delay lines of a slave circuit will consume no current without input signals (i.e., input signals are constantly equal to logic level 0 or logic level 1). This leads to a different control voltage between a master circuit and a slave circuit, and leads to jitters.

BRIEF SUMMARY OF THE INVENTION

For solving the foregoing problems, the invention provides a delay locked loop circuit with master-slave designs so as to improve jitters.

In one exemplary embodiment, the disclosure is directed to a delay locked loop (DLL) circuit for improving jitters, comprising: a detecting unit, detecting a phase difference between a reference clock and a delay clock, and generating a detecting signal in response to the phase difference; a master controller, generating a first control signal in response to the detecting signal; a slave controller, generating a second control signal in response to the detecting signal; a first variable delay line, delaying the reference clock in response to the first control signal so as to generate the delay clock; a second variable delay line; a first dummy load, coupled to the master controller; a second dummy load, coupled to the slave controller; and a processor, selectively generating a slave input signal in response to a input control signal, wherein, if the processor does not generate the slave input signal, the processor makes the second dummy load draw a load current from the slave controller; and if the process generates the slave input signal, the second variable delay line delays the slave input signal in response to the second control signal so as to generate a slave output signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
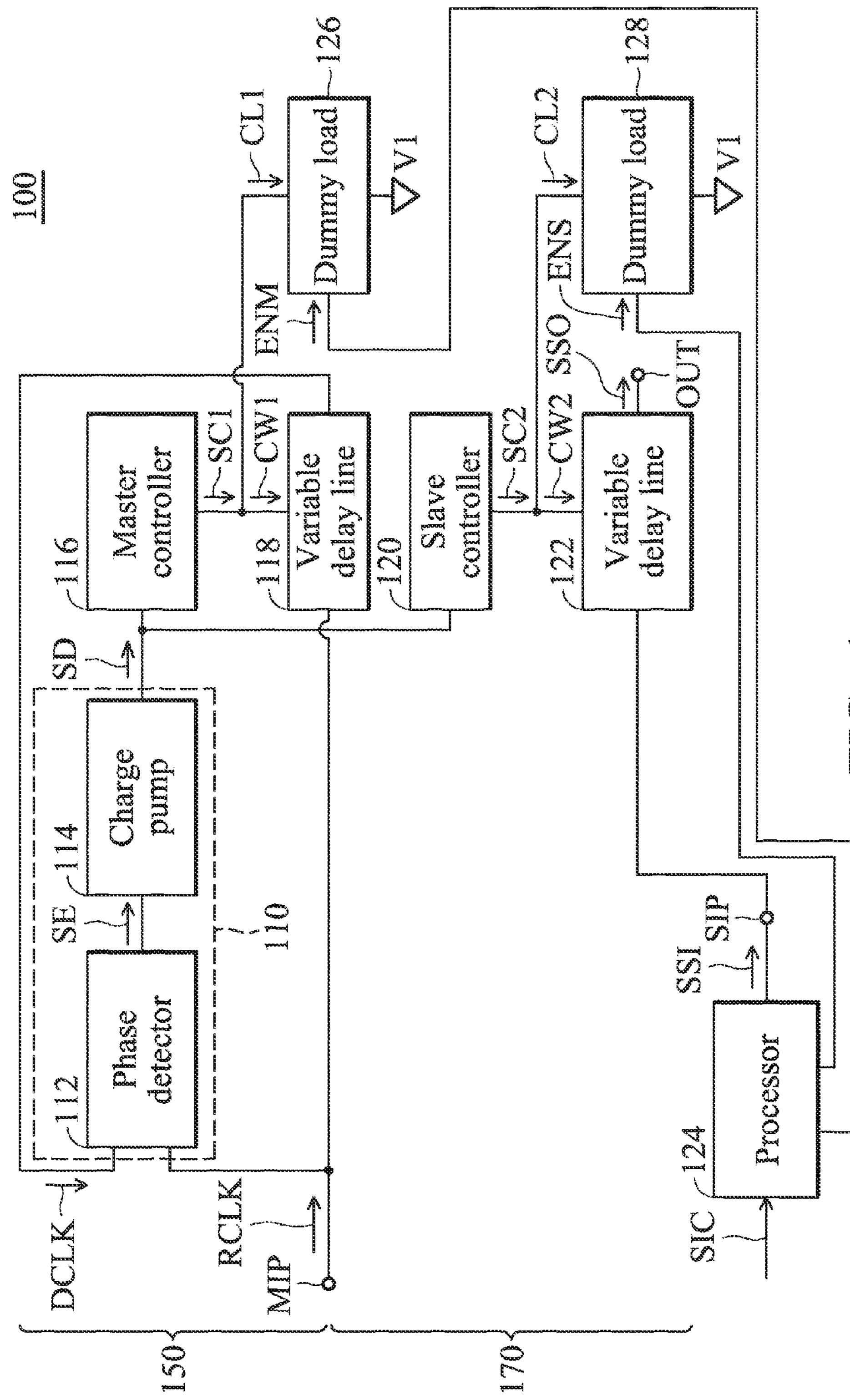
FIG. 1 is a diagram for illustrating a delay locked loop circuit according to an embodiment of the invention.

FIG. 1 is a diagram for illustrating a delay locked loop circuit 100 according to an embodiment of the invention. As shown in FIG. 1, the delay locked loop circuit 100 comprises: a detecting unit 110, a master controller 116, variable delay lines 118 and 122, a slave controller 120, a processor 124, and dummy loads 126 and 128. The delay locked loop circuit 100 may be classified into a master circuit 150 and a slave circuit 170, wherein the master circuit 150 comprises the detecting unit 110, the master controller 116, the variable delay line 118 and the dummy load 126; the slave circuit 170 comprises the slave controller 120, the variable delay line 122 and the dummy load 128. The master circuit 150 has a master input terminal MIP for receiving a reference clock RCLK, and the slave circuit 170 has a slave input terminal SIP for receiving a slave input signal SSI and a slave output terminal OUT for outputting a slave output signal SSO. In some embodiments, the slave input signal SSI is a signal applied to DDR DRAM (Double Data Rate Dynamic Random Access Memory), for example, a DQS signal.

The detecting unit 110 is configured to detect a phase difference between the reference clock RCLK and a delay clock DCLK and to generate a detecting signal SD in response to the phase difference. More particularly, the detecting unit 110 comprises a phase detector 112 and a charge pump 114, wherein the phase detector is configured to detect the phase difference between the reference clock RCLK and the delay clock DCLK so as to generate a phase signal SE, and then the charge pump 114 is configured to generate the detecting signal SD in response to the phase signal SE.

Each of the master controller 116 and the slave controller 120 may be a voltage regulator or a current generator. The master controller 116 may generate a control signal SC1 in response to the detecting signal SD, and the slave controller 120 may generate a control signal SC2 in response to the detecting signal SD.

Each of the variable delay lines 118 and 122 may be a voltage controlled delay line (VCDL) or a current controlled delay line (CCDL). The variable delay line 118 is configured to delay the reference clock RCLK for a first predetermined time in response to the control signal SC1 so as to generate the delay clock DCLK. If the processor 124 generates the slave input signal SSI, the variable delay line 122 may delay the slave input signal SSI for a second predetermined time in response to the control signal SC2 so as to generate the slave output signal SSO.

The dummy load 126 is electrically connected to the master controller 116, the variable delay line 118 and a specific voltage V1. The specific voltage V1 may be an inner node voltage or a ground voltage Vss (e.g., 0V) of the delay locked loop circuit 100. The dummy load 126 may determine whether to draw a load current CL1 from the master controller 116 in response to a master enable signal ENM. In some embodiments, if the master enable signal ENM is equal to a work voltage Vdd (e.g., 1.8V or 3V) of the delay locked loop circuit 100, the dummy load 126 can draw the load current CL1 from the master controller 116. If the master enable signal ENM is equal to the ground voltage Vss, the dummy load 126 cannot draw any current from the master controller 116.

Similarly, the dummy load 128 is electrically connected to the slave controller 120, the variable delay line 122 and the specific voltage V1. The dummy load 128 may determine whether to draw a load current CL2 from the slave controller 120 in response to a slave enable signal ENS. In some embodiments, if the slave enable signal ENS is equal to the work voltage Vdd, the dummy load 128 can draw the load current CL2 from the slave controller 120. If the slave enable signal ENS is equal to the ground voltage Vss, the dummy load 128 cannot draw any current from the slave controller 120.

The processor 124 is configured to selectively generate the slave input signal SSI so as to selectively generate the master enable signal ENM and/or the slave enable signal ENS. For example, if the processor 124 receives an input control signal SIC, the processor 124 will generate the slave input signal SSI. If the processor 124 does not receive the input control signal SIC, the processor 124 will not generate the slave input signal SSI. In a preferred embodiments of the invention, if the processor 124 does not generate the slave input signal SSI (or maintaining a stable state, i.e., the slave input signal SSI is always equal to the work voltage Vdd or the ground voltage Vss), the processor 124 will generate the slave enable signal ENS to be equal to the work voltage Vdd so as to make the dummy load 128 draw the load current CL2 from the slave controller 120. If the processor 124 generates the slave input signal SSI (or the slave input signal SSI has different voltage levels), the processor 124 will generate the slave enable signal ENS to be equal to the ground voltage Vss so as to prevent the dummy load 128 from drawing any current from the slave controller 120.

More particularly, if the processor 124 generates the slave input signal SSI, the variable delay line 122 will draw a work current CW2 from the slave controller 120 normally. However, if the processor 124 does not generate the slave input signal SSI, the variable delay line 122 will not draw any current from the slave controller 120. Under this circumstance, the dummy load 128 can draw the load current CL2, which is approximately equal to the work current CW2, so as to compensate for the lack of current consumption in the variable delay line 122.

Similarly, the dummy load 126 may determine whether to draw a load current CL1, which is approximately equal to a work current CW1, from the master controller 116 in response to the master enable signal ENM generated by the processor 124. In a preferred embodiment, since there is a stable reference clock RCLK input into the master input terminal MIP, the master enable signal ENM may be always equal to the ground voltage Vss so as to prevent the dummy load 126 from drawing any current from the master controller 116. In other embodiments, the dummy load 126 may be removed from the delay locked loop circuit 100.

Figure 2:
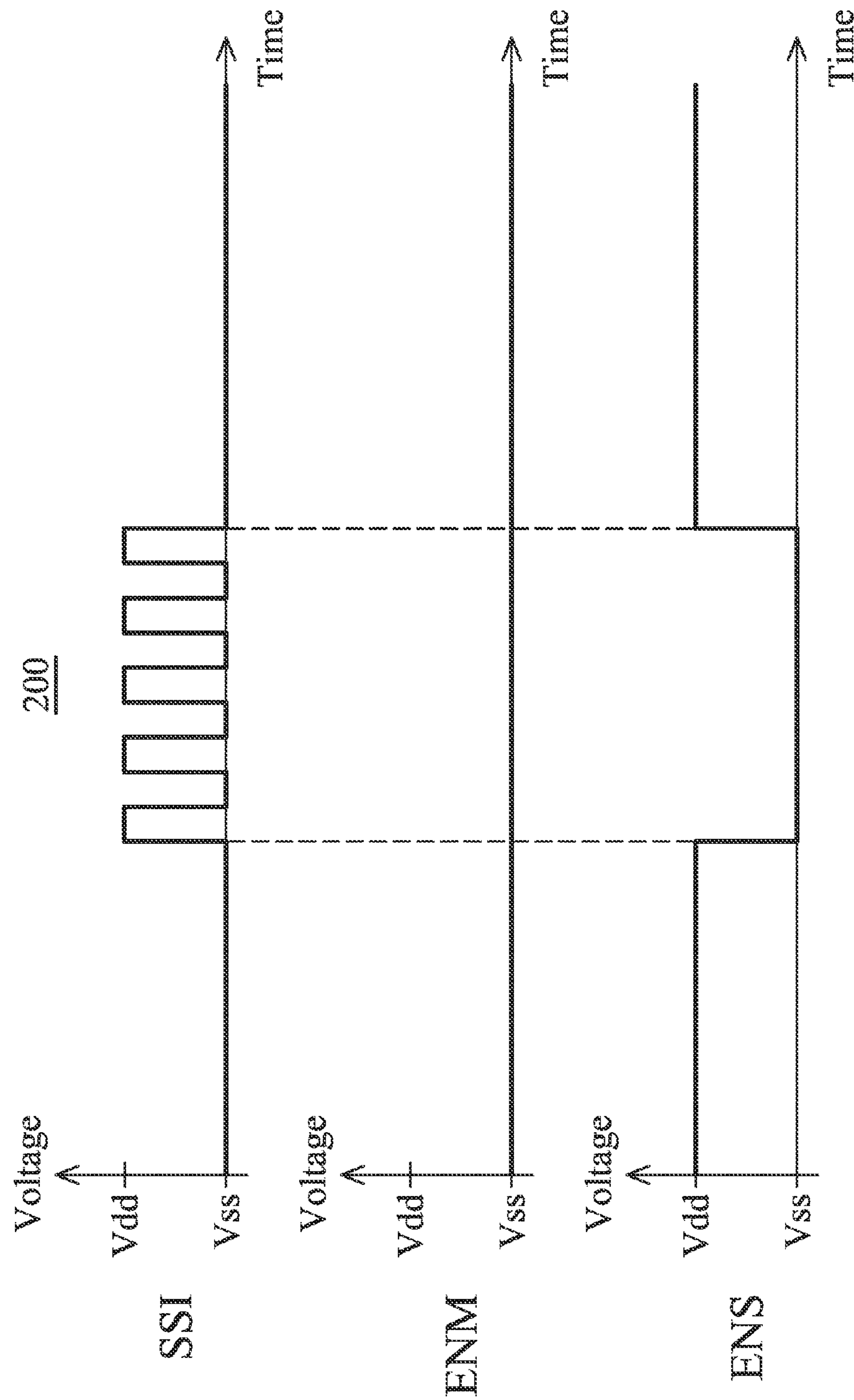
FIG. 2 is a diagram for illustrating the relation between voltages of signals and time according to an embodiment of the invention.
Figure 3:
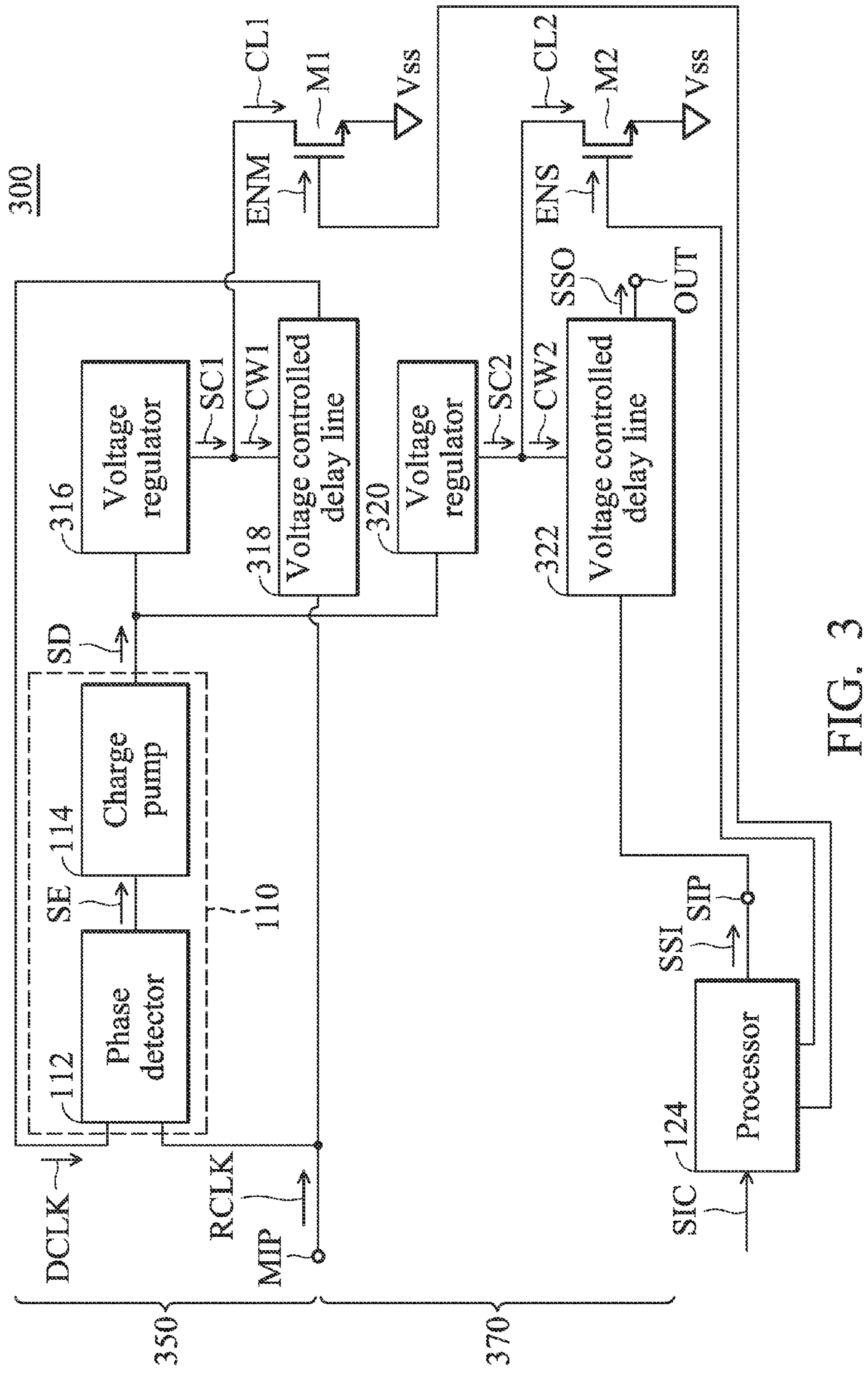
FIG. 3 is a diagram for illustrating a delay locked loop circuit according to another embodiment of the invention.

FIG. 2 is a diagram for illustrating the relation between voltages of signals and time according to an embodiment of the invention, which is applied to the delay locked loop circuit 100 as shown in FIG. 1 and a delay locked loop circuit 300 as shown in FIG. 3. In an embodiment, the processor 124 generates the slave input signal SSI, the master enable signal ENM and the slave enable signal ENS. Voltages of the foregoing signals are shown in FIG. 2. The main characters are as follows: (1) if the processor 124 does not generate the slave input signal SSI, or if the slave input signal SSI maintains a stable state (i.e., the slave input signal SSI is always equal to the work voltage Vdd or the ground voltage Vss), the slave enable signal ENS is equal to the work voltage Vdd. If the slave input signal SSI changes over time, the slave enable signal ENS is equal to the ground voltage Vss; and (2) the master enable signal ENM is always equal to the ground voltage Vss.

FIG. 3 is a diagram for illustrating a delay locked loop circuit 300 according to another embodiment of the invention. The delay locked loop circuit 300, comprising a master circuit 350 and a slave circuit 370, is similar to the delay locked loop circuit 100 as shown in FIG. 1. The differences between them are as follows: (1) the delay locked loop circuit 300 selects a voltage regulator 316 as the master controller 116, and selects a voltage regulator 320 as the slave controller 120; (2) the delay locked loop circuit 300 selects a voltage controlled delay line 318 as the variable delay line 118, and selects a voltage controlled delay line 322 as the variable delay line 122; (3) the delay locked loop circuit 300 selects an NMOS transistor (N-channel Metal-Oxide-Semiconductor Field-Effect Transistor) M1 as the dummy load 126, and selects an NMOS transistor M2 as the dummy load 128; and (4) the delay locked loop circuit 300 selects the ground voltage Vss as the specific voltage V1. It is assumed in the embodiment that the NMOS transistor M1 is turned on (closed) when the master enable signal ENM is equal to the work voltage Vdd, and/or the NMOS transistor M2 is turned on (closed) when the slave enable signal ENS is equal to the work voltage Vdd.

The NMOS transistor M1 has a gate, a source and a drain, wherein the gate is configured to receive the master enable signal ENM generated by the processor 124. The source is electrically connected to the ground voltage Vss. The drain is electrically connected to the voltage regulator 316 and the voltage controlled delay line 318. In some embodiments, the gate of the NMOS transistor M1 is always electrically connected to the ground voltage Vss. In another embodiment, the NMOS transistor M1 may be removed from the delay locked loop circuit 300. The NMOS transistors M2 has a gate, a source and a drain, wherein the gate is configured to receive the slave enable signal ENS generated by the processor 124. The source is electrically connected to the ground voltage Vss. The drain is electrically connected to the voltage regulator 320 and the voltage controlled delay line 322.

If the processor 124 does not generate the slave input signal SSI, the processor 124 will generate the slave enable signal EMS to be equal to the work voltage Vdd so as to turn on the NMOS transistor M2 and if the processor 124 generates the slave input signal SSI, the processor 124 will generate the slave enable signal EMS to be equal to the ground voltage Vss so as to turn off the NMOS transistor M2. Also, the processor 124 may generate the master enable signal ENM which is always equal to the ground voltage Vss so as to turn off the NMOS transistor M1. The relation of the foregoing signals may be as shown in FIG. 2

It is noted that although only a single slave circuit is shown in FIG. 1 or FIG. 3, the delay locked loop circuits 100 and 300 of the invention may comprise a plurality of slave circuits. With the dummy loads, the delay locked loop circuit 100 (300) can make the control voltage of the master controller 116 (voltage regulator 316) equal to that of the slave controller 120 (voltage regulator 320) so as to improve jitters in the delay locked loop circuit.

Figure 4:
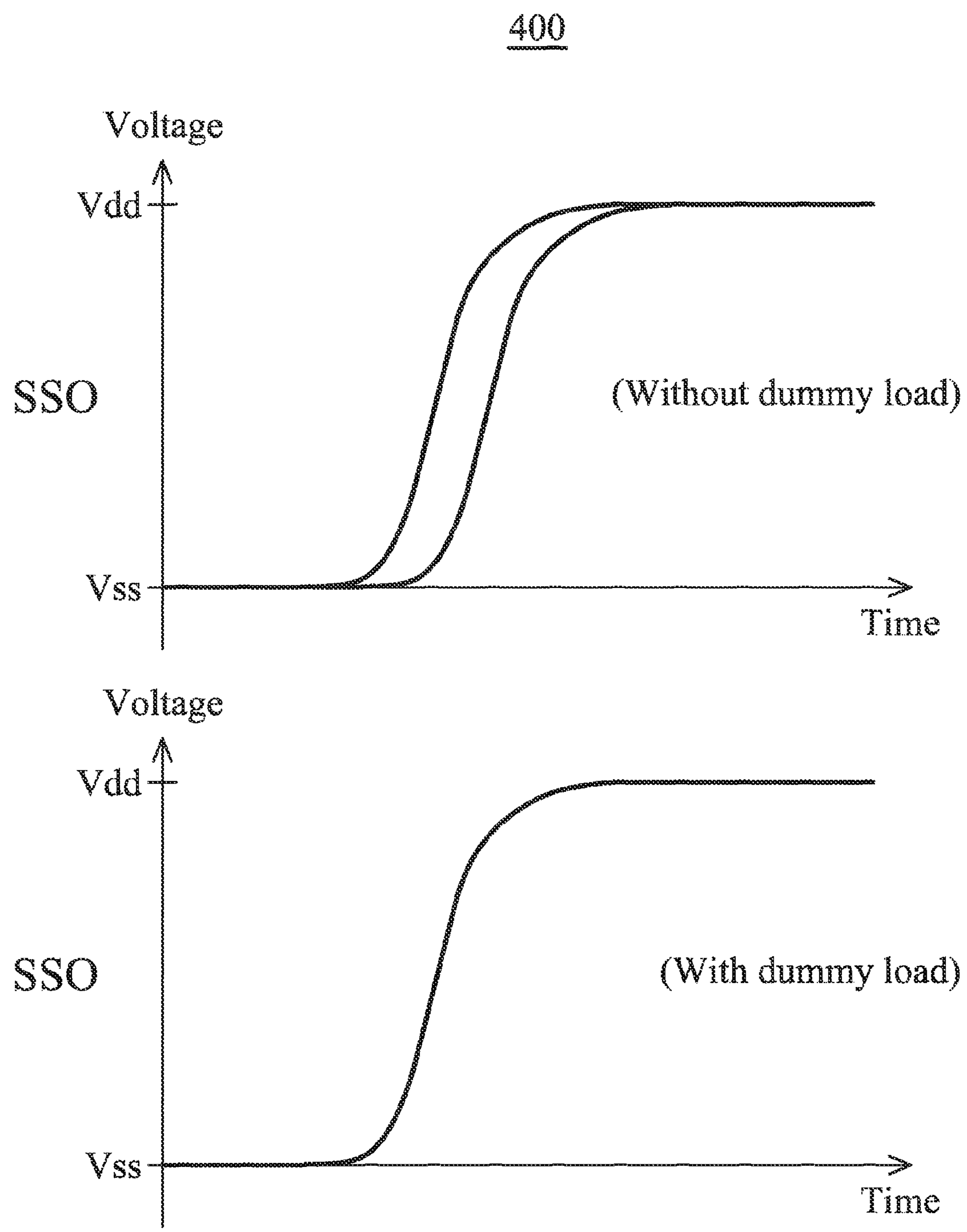
FIG. 4 is a diagram for illustrating the relation between voltages of the slave output signal and time according to an embodiment of the invention.

FIG. 4 is a diagram for illustrating the relation between voltages of the slave output signal SSO and time according to an embodiment of the invention. As shown in FIG. 4, it is apparent that a delay locked loop circuit with dummy loads (e.g., the NMOS transistor M2 in FIG. 3) generates less jitter than those generated by delay locked loop circuits without dummy loads. That is, one or more slave output signals SSO may be measured when the jitter problem is serious.

Use of ordinal terms such as “first”, “second”, “third”, etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A delay locked loop (DLL) circuit for improving jitters, comprising:

a detecting unit, detecting a phase difference between a reference clock and a delay clock, and generating a detecting signal in response to the phase difference;

a master controller, generating a first control signal in response to the detecting signal;

a slave controller, generating a second control signal in response to the detecting signal;

a first variable delay line, delaying the reference clock in response to the first control signal so as to generate the delay clock;

a second variable delay line;

a first dummy load, coupled to the master controller;

a second dummy load, coupled to the slave controller; and a processor, selectively generating a slave input signal in response to a input control signal, wherein:

if the processor does not generate the slave input signal, the processor makes the second dummy load draw a load current from the slave controller; and if the process generates the slave input signal, the second variable delay line delays the slave input signal in response to the second control signal so as to generate a slave output signal.

2. The delay locked loop circuit as claimed in claim 1, wherein if the processor generates the slave input signal, the processor makes the second dummy load not draw the load current from the slave controller.

3. The delay locked loop circuit as claimed in claim 1, wherein if the current from the slave controller, wherein the work current is approximately equal to the load current.

4. The delay locked loop circuit as claimed in claim 1, wherein the first dummy load is a first NMOS transistor (N-channel Metal-Oxide-Semiconductor Field-Effect Transistor), and the second dummy load is a second NMOS transistor.

5. The delay locked loop circuit as claimed in claim 4, wherein the first NMOS transistor has a first gate coupled to a ground voltage.

6. The delay locked loop circuit as claimed in claim 4, wherein the second NMOS transistor has a second gate for receiving a slave enable signal from the processor.

7. The delay locked loop circuit as claimed in claim 6, wherein the processor is further configured to:

generate the slave enable signal equal to a work voltage if the processor does not generate the slave input signal; and generate the slave enable signal equal to a ground voltage if the processor generates the slave input signal, wherein the work voltage is higher than the ground voltage.

8. The delay locked loop circuit as claimed in claim 1, wherein the detecting unit comprises a phase detector for detecting the phase difference so as to generate a phase signal, and a charge pump for generating the detecting signal in response to the phase signal.

9. The delay locked loop circuit as claimed in claim 1, wherein each of the master controller and the slave controller is a voltage regulator.

10. The delay locked loop circuit as claimed in claim 1, wherein each of the first and second delay lines is a voltage controlled delay line.

* * * * *